United States Patent [19]

Kalina

[11] Patent Number: 4,783,714

[45] Date of Patent: Nov. 8, 1988

[54] SWITCHING LOGIC DRIVER WITH OVERCURRENT PROTECTION

[75] Inventor: Roger J. Kalina, San Diego, Calif.

[73] Assignee: General Dynamics Electronics Division, San Diego, Calif.

[21] Appl. No.: 28,729

[22] Filed: Mar. 23, 1987

[51] Int. Cl.⁴ .............................................. H02H 3/093
[52] U.S. Cl. ...................................... 361/101; 361/93; 363/56
[58] Field of Search .................... 361/93, 98, 100, 101; 363/56

[56] References Cited

U.S. PATENT DOCUMENTS

| | | | |
|---|---|---|---|
| 4,453,193 | 6/1984 | Huang et al. | 361/98 |
| 4,595,966 | 6/1986 | Huber et al. | 361/93 |
| 4,628,393 | 12/1986 | Gareis et al. | 261/98 |
| 4,651,252 | 3/1987 | Babinski | 361/93 |

Primary Examiner—G. P. Tolin
Assistant Examiner—Derek S. Jennings
Attorney, Agent, or Firm—Brown, Martin, Haller & Meador

[57] ABSTRACT

A logic driver having control circuitry for receiving an input bistate data bit and providing power at an output at first and second predetermined voltage levels when an input bistate data bit is respectively of first and second states. Sensing circuitry is coupled to the control circuitry for detecting the level of current at the output and providing a corresponding current level indication. The driver further includes overcurrent circuitry, responsive to the current level indication, for generating an overcurrent command when the output current exceeds a predetermined level. The control circuitry is responsive to the overcurrent command for disabling the output of power at the corresponding predetermined voltage level at the output.

16 Claims, 3 Drawing Sheets

SWITCHING LOGIC DRIVER WITH OVERCURRENT PROTECTION

BACKGROUND OF THE INVENTION

I. Field of the Invention

The present invention relates to logic drivers. More specifically, the present invention relates to a programmable logic driver circuit for implementation in automatic test equipment wherein the logic driver circuit includes overcurrent protection circuitry.

II. Background Art

Automatic test equipment (ATE) systems are currently used in testing electronic assemblies and subassemblies at various stages in the manufacturing process. For the testing of digital electronic equipment, the ATE system usually incorporates a logic driver for providing logic states to the unit under test. The ATE system in exercising the unit under test provides predetermined logic states as an input to the test unit. The ATE system then monitors the responses of the unit under test to the predetermined inputs. The response data is used in determining whether the unit under test contains a component or manufacturing related defect.

Logic drivers previously used in ATE systems have been linear-type drivers which utilize linear feedback overcurrent protection circuits. When an electrical short occurs at the output of these types of logic driver, due to a defect in the unit under test, the driver momentarily provides a high current output until the overcurrent condition is detected by the driver's overcurrent protection circuit. Once the overcurrent condition is detected the overcurrent protection circuit regulates the driver output current at a constant predetermined maximum value. During the overcurrent condition the drive output current is typically higher than the maximum operating current of the driver. Therefore, significant power dissipation occurs during the overcurrent condition. Accordingly, the driver output elements must be capable of handling, on a continuous basis, higher power outputs. In addition, larger capacity heat sinks must be used for the output elements.

It is, therefore, an object of the present invention to provide a novel and improved programmable logic driver with overcurrent protection which features low power dissipation and high speed operation.

It is yet another object of the present invention to provide a switching logic driver for ATE systems which operates in a switching mode and uses cutoff current limiting protection to achieve minimum power dissipation and component count.

It is yet a further object of the present invention to provide a programmable logic driver with reduced heat sinking requirements and low power driver output components.

SUMMARY OF THE INVENTION

In one embodiment of the invention, a logic driver is provided for providing power, received from an external power source, switched between two voltage levels in response to an input bistate data bit. The logic driver includes input means for receiving an input bistate data bit and generating a control command corresponding to the state of the input bistate data bit. Switch means are included for receiving power from the external power source. The switch means is responsive to the control command for providing power at an output at a first predetermined voltage level when the input bistate data bit is of a first state and at a second predetermined voltage level when the input bistate data bit is of a second state. Sense means is coupled to the switch means for detecting the level of current provided from an external power source to the output. The sense means in response to the level of current provides a corresponding current level indication. The driver further includes overcurrent means responsive to the current level indication for generating an overcurrent command when the output current exceeds a predetermined level. The switch means if further responsive to the overcurrent command for disabling the output of power at the corresponding predetermined voltage level at the output.

The input means is comprised of digital logic gates and voltage translators. The logic gates provide control logic signals to the switching circuitry through the voltage translators. The voltage translators convert the voltage level of the logic gates to those required by the switching circuitry.

The switching means is comprised of a pair of differential amplifiers which drive either complementary MOSFET or bipolar power transistors. The transistors switch power, provided to the circuit from an external power source, between two voltage levels corresponding to the state of the input data bit.

The sense means is comprised of resistors in series between the output of the external power source and the power transistors. The voltage developed across each resistor corresponds to the current provided by the power source to the load through a corresponding transistor. The voltage developed across the sense resistors is provided to the overcurrent means which is one embodiment is a thyristor-based control circuit which directly controls the switching of the power transistor.

In the alternative embodiment of the logic driver, the overcurrent means may be implemented as a comparator based control circuitry. The comparator circuitry provide control signals to the input means for disabling the switching of the power transistors.

BRIEF DESCRIPTION OF THE DRAWINGS

These and other features, objects, and advantages of the present invention will be more fully apparent from the detailed description set forth below taken in conjunction with the drawings in which like reference characters identify correspondingly throughout and wherein.

DETAILED DESCRIPTION OF THE PREFERRED EMBODIMENTS

Figure 1:
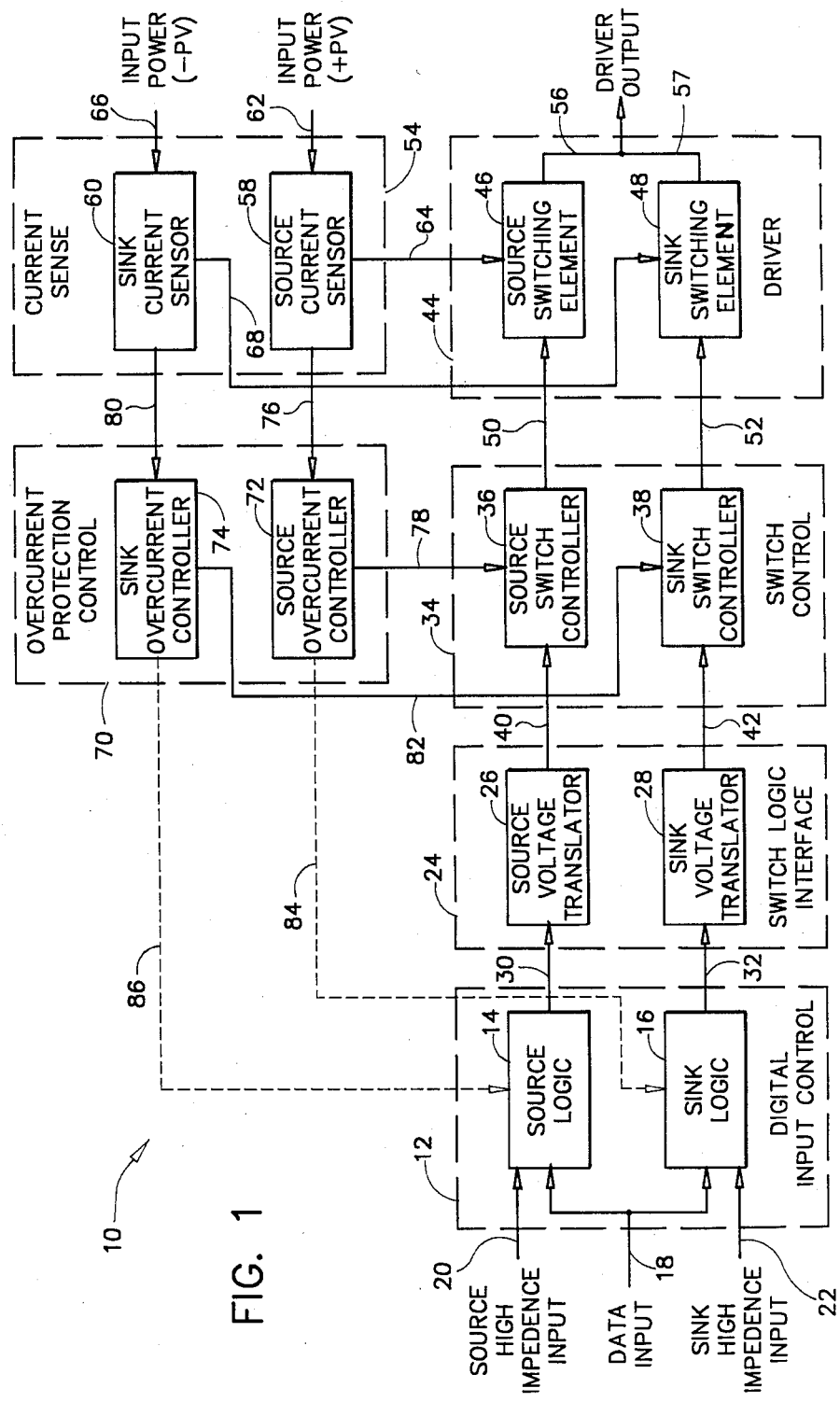
FIG. 1 is a block diagram of the switching logic driver with overcurrent protection of the present invention.

Referring to FIG. 1, there is shown in block diagram form switching logic driver 10 of the present invention. Switching logic driver 10 is comprised of digital input control section 12, switch logic interface section 24 switch control section 34, driver section 44, current sense section 54 and overcurrent protection control section 70.

Digital input control section 12 is comprised of source logic 14 and sink logic 16. Bistate data bits are provided from an external logic bit generator (not shown) as an input to digital input control section 12. The input data bits are provided on line 18 as inputs to both source logic 14 and sink logic 16. Source logic 14 and sink logic 16 also respectively receive externally generated bistate control signals, source high impedence (HI-Z) input signal and sink high impedance (HI-Z) input signal, on lines 20 and 22 from an external source (not shown). These control signals, whose operation is described in greater detail later herein, are each used to disable a switching element in driver section 44.

Source logic 14 and sink logic 16 are responsive to the state of an input data bit and the HI-Z input signals so as to provide a corresponding bistate logic signal. Source logic 14 in response to an input data bit and a source HI-Z input signal provides a bistate source logic signal to switch interface section 24. Similarly, sink logic 16 in response to an input data bit and a sink HI-Z input signal provides a bistate sink logic signal to switch interface section 24.

Switch interface 24 is comprised of a pair of voltage translators, source voltage translator 26 and sink voltage translator 28. The source logic signal provided from the output of source logic 14 is coupled to the input of source voltage translator 26 by line 30. Similarly, the sink logic signal provided from the output of sink logic 16 is coupled to the input of sink voltage translator 26 by line 32.

Source voltage translator 26 and sink voltage translator 28 adjust the voltage levels of the logic signals output from the logic gates of source logic 14 and sink logic 16. The voltage levels of the output logic signals are adjusted to the operational voltage levels necessary to drive the following switching circuitry. The converted logic signals output from source voltage translator 26 and sink voltage translator 28 are input to switch control section 34. Switch control section 34 is comprised of source switch controller 36 and sink switch controller 38.

The converted logic signal output from source voltage translator 26 is coupled on line 40 to a switch control input of source switch controller 36. Similarly, the converted logic signal output from sink voltage translator 28 is coupled on line 42 to a switch control input of sink switch controller 38. Source switch controller 36 and sink switch controller 38, in response to respectively received converted source and sink logic signal, provide corresponding switch control signals to driver section 44.

Driver section 44 is comprised of a pair of complementary switching elements, source switching element 46 and sink switching element 48. The source switch control signal output from source switch controller 36 is coupled on line 50 to a control input of source switching element 46. Similarly, the sink switch control signal output from sink switch controller 38 is coupled on line 52 to a control input of sink switching element 48. Source switching element 46 and sink switching element 48 are each provided with power from an external power source (not shown). Input power is provided to driver section 44 through current sense section 54.

The external power source includes a positive programmable power supply (not shown) that provides the input voltage (+PV) and corresponding current to source switching element 46. Also included in the external power source is a negative programmable power supply (not shown) that provides the input voltage (−PV) and corresponding current to sink switching element 48. Therefore, depending upon the state of the input data bit as input to digital input control section 12, the driver section output assumes a corresponding positive or negative programmed voltage. A positive voltage ouput is from source switching element 46 while a negative voltage output is output from sink switching element 48.

Although "normal" operation is defined as output positive when input data bit is high, and output negative when input data bit is low, it is feasible and required in some applications that "+PV" be a negative voltage and/or "−PV" be a positive voltage. In those applications where the input voltages +PV and −PV are both positive voltages, the voltage +PV is at a greater positive potential then the voltage −PV. Similarly, where the input voltages +PV and −PV are both negative voltages the voltage −PV is to be at a greater negative potential than the voltage +PV.

When the input source HI-Z signal is in one state there is no effect on the source switching element. However, when the input source HI-Z signal is in the other state, irrespective of the state of the input data bit, the source switching element is disabled or "turned off" so as to provide a high impedance output. Similarly, when the input sink HI-Z signal is in one state there is no effect on the sink switching element. However, when the input sink HI-Z signal is in the other state, irrespective of the state of the input data bit, the sink switching element is disabled or "turned off" so as to provide a high impedance output.

Current sense section 54 is comprised of a pair of current sensors, source current sensor 58 and sink current sensor 60. The input voltage +PV from the positive programmable power supply is coupled on line 62 to an input of source current sensor 58. Source current sensor 58 couples the power from the positive programmable power supply on line 64 to a power input of source switching element 46. Similarly, the input voltage −PV from the negative programmable power supply is coupled on line 66 to an input of sink current sensor 60. Sink current sensor 60 couples the power from the negative programmable power supply on line 68 to a power input of sink switching element 48. Source current sensor 58 and sink current sensor 60 respectively sense the current flow to source switching element 46 and sink switching element 48 and generate corresponding current level signals. The current level signals are coupled to overcurrent protection control section 70.

Overcurrent protection control section 70 is comprised of a pair of overcurrent controllers, source overcurrent controller 72 and sink overcurrent controller 74. Source current sensor 58 provides the source current level signal on line 76 to an input of source overcurrent controller 72. Source overcurrent controller 72 monitors the source current level signal for an indication of an overcurrent condition in the current flowing through source switching element 46. An overcurrent condition arises when excessive current flows through switching element 46 to a load coupled to the driver output. The overcurrent condition typically occurs when there is an electrical short circuit in the load.

When a source overcurrent condition occurs, source overcurrent controller 72 provides a source overcurrent signal that is coupled on line 78 to an overcurrent control input of source switch controller 36. Source switch controller 36, in response to the source overcurrent signal, provides a source switch signal to source switching element 46 which disables or turns off source switching element 46. Therefore, source switching element 46 goes to a high impedance output state. With source switching element 46 disabled, there is no current flowing on line 56 to the driver output which further results in no power dissipation in switching element 46.

Sink overcurrent controller 74 operates in a similar manner to source overcurrent controller 72. Sink current sensor 60 provides the sink current level signal on line 80 to an input of sink overcurrent controller 74. Sink overcurrent controller 74 monitors the sink current level signal for an indication of an overcurrent condition in the current flowing through sink switching element 48. An overcurrent condition arises when excessive current flows through sink switching element 48 to a load coupled to the driver output. Again the overcurrent condition typically occurs when there is a short circuit in the load.

When a sink overcurrent condition occurs, sink overcurrent controller 74 provides a sink overcurrent condition signal that is coupled on line 82 to an overcurrent control input of sink switch controller 38. Sink switch controller 38, in response to the overcurrent signal, provides a sink switch signal to sink switching element 48 which disables or "turns off" sink switching element 48. Therefore, sink switching element 48 goes to a high impedance output state. With sink switching element 48 disabled, there is no current flowing on line 57 to the driver output which further results in no power dissipation in switching element 48.

In an alternate embodiment, source overcurrent controller 72 and sink overcurrent controller 74 each output a corresponding overcurrent signal respectively on lines 84 and 86 to a respective overcurrent control input of source logic 14 and sink logic 16. Source logic 14 and sink logic 16 in response to a respective overcurrent signal provide an output signal which is propagated through switch interface section 24, switch control section 34 to driver section 44 so as to disable the corresponding switching element.

In either embodiment, the input bistate source HI-Z signal is coupled to the source HI-Z inputs of source logic 14. Similarly, the input bistate sink HI-Z signal is coupled to the sink HI-Z input of sink logic 16. Source logic 14 or sink logic 16 in response to a predetermined state of the input bistate HI-Z signal modifies the state of the source or sink logic signal so as to disable the corresponding switching element. The source and sink logic signals are coupled through switch interface section 24 to switch control section 34 which controls the on-off state of a corresponding switching element of driver section 44. A disabled switching element provides a high impedance output irrespective of the state of the input data bit. In effect, the source and sink HI-Z signals override the input data in controlling the on-off state of the switching element.

Normal operation of the logic driver is typically such that a "high" data bit input results in the source switching element being turned on with the sink switching element turned off. In this condition a positive voltage appears at the driver output with the sink switching element in a high impedance output state. Similarly, when a "low" data bit is input to the logic driver, the sink switching element is turned on and the source switching element is turned off. In this condition a negative voltage appears at the driver output with the source switching element in the high impedance state.

It is an important aspect of the present invention that the output driver elements operate in a switching, as opposed to linear, mode and are under feedback control. As a result of the feedback control, a cut-off in output current from the respective switching element occurs during an overcurrent condition. No other logic driver has included overcurrent feedback control that cuts off the driver output current during an overcurrent condition. The cut-off current limiting feature, in concert with high-speed switching-mode operation, distinguishes the present invention over conventional logic driver circuits.

Summarizing conventional logic driver overcurrent protection circuits, these circuits typically regulate the output current to a predetermined maximum value. The predetermined maximum value is generally higher than the maximum operating current level of the switching element. Therefore, power dissipation is highest when a short circuit condition occurs at the driver output. Therefore, the driver output elements must be selected with high power components which require greater heat sinking.

The present invention by using complementary output switching elements under feedback control eliminates the constant output current during an overcurrent condition. The embodiments of the present invention virtually eliminate, other than momentarily, the high output current normally associated with the overcurrent condition. As such, low power switching elements and with low heat sinking requirements may be implemented. A logic driver constructed using the teachings of the present invention permits simplicity in design with low power component and ultimately a low component count.

Figure 2:
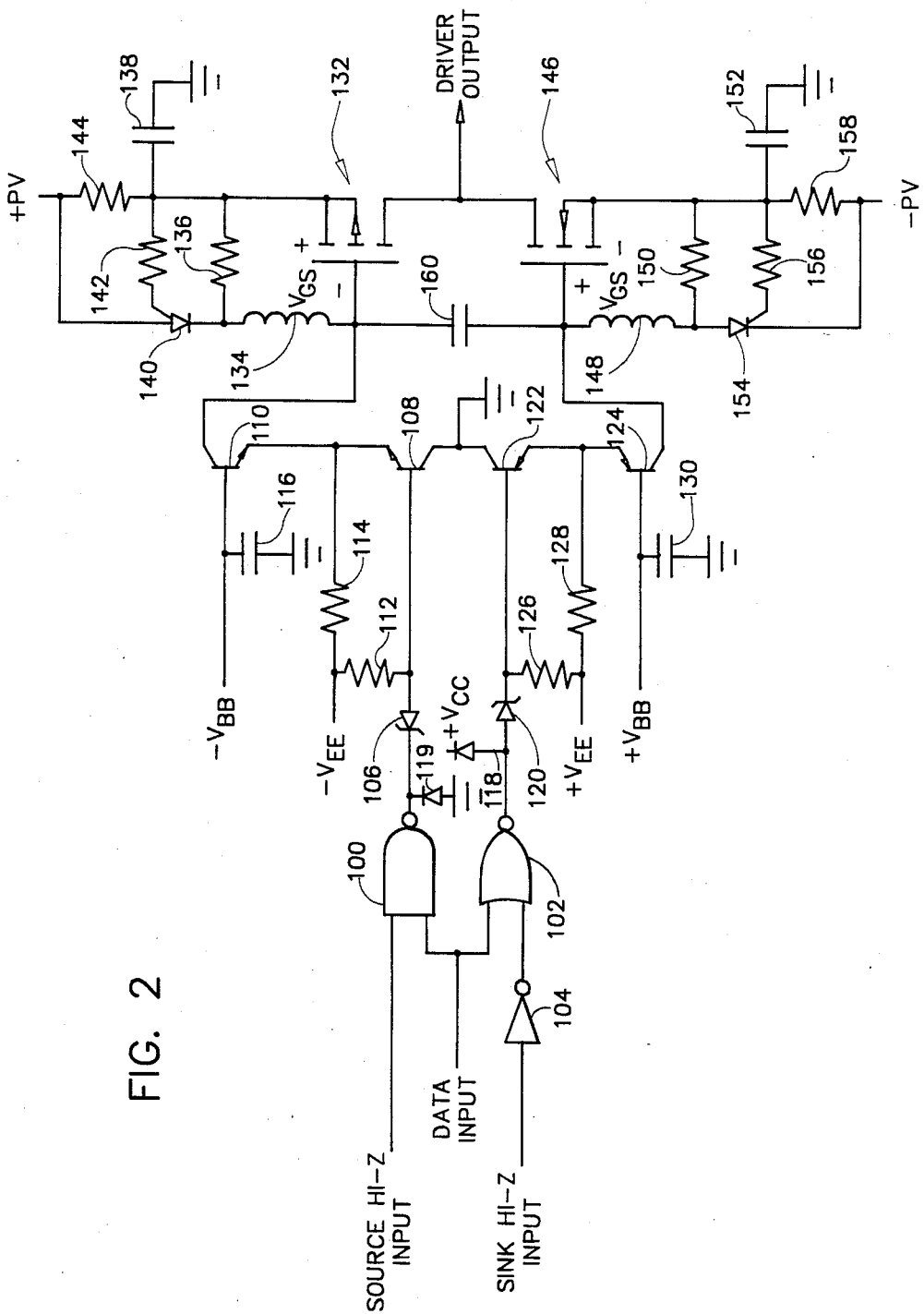
FIG. 2 is a schematical diagram of one embodiment of the switching logic driver with overcurrent protection.

FIG. 2 is a schematical diagram of one embodiment of the present invention. The logic driver of FIG. 2 uses MOSFET complementary transistors as the switching elements in combination with thyristor controlled overcurrent protection circuitry. Input bistate data bits from an external logic bit generator are each provided simultaneously to a respective input of NAND gate 100 and NOR gate 102. An input bistate source HI-Z signal is coupled to the other input of NAND gate 100 while the input bistate sink HI-Z signal is coupled through invertor 104 to the other input of NOR gate 102. NAND gate 100, NOR gate 102 and invertor 104 provide the necessary logic in the digital input control section for performing boolean logic operations on the input bistate data and HI-Z input signals. The state of the output bistate signals from NAND gate 100 and NOR gate 102 are the source of the control signals which command the driver output circuitry.

The output of NAND gate 100 is connected to the cathode of diode 119. The anode of diode 119 is coupled to ground. Diode 119 is used at the output of NAND gate 100 if the device implemented as NAND gate 100 can not source current when the gate output is in the low or logic "0" state.

The output of NAND gate 100 is also coupled to the cathode of zener diode 106. The anode of zener diode 106 is coupled to the base of transistor 108. Transistors 108 and 110 and their associated bias circuitry form a differential amplifier. Zener diode 106 provides the necessary source voltage translation function while the differential amplifier provides the source switch control function.

The base of transistor 108 is coupled through bias resistor 112 to an external power supply (not shown) which provides the negative reference voltage $-V_{EE}$. The emitter of transistor 108 is also coupled to the reference voltage $-V_{EE}$ through bias resistor 114. The collector of transistor 108 is coupled to ground and another differential amplifier as described later.

The emitter of transistor 110 is coupled to the emitter transistor 108 with the reference voltage $-V_{EE}$ being provided to the emitter of transistor 110 through resistor 114. The base of transistor 110 is coupled to an external power supply (not shown) which provides the negative reference voltage $-V_{BB}$. The base of transistor 110 is also coupled to ground through filter capacitor 116. The collector of transistor 110 is coupled to the source driver circuitry as described later.

The output of NOR gate 102 is connected to the anode of tie-up diode 118. The cathode of diode 118 is coupled to an external power supply (not shown) which provides the positive reference voltage $+V_{CC}$. Diode 118 is used at the output of NOR gate 102 so as to limit positive voltage to a diode drop above $+V_{CC}$. This is required if the NOR gate 102 is implemented with a device that cannot sink current in the logic "1" or high state.

The output of NOR gate 102 is also coupled to the anode of zener diode 120. The cathode of zener diode 120 is coupled to the base of transistor 122. Transistors 122 and 124 and their associated bias circuitry form a differential amplifier. Zener diode 120 provides the necessary sink voltage translation function while the differential amplifier provides the sink switch control function.

The base of transistor 122 is coupled through bias resistor 126 to the reference voltage $+V_{EE}$ provided by an external power supply (not shown). In addition, the reference voltage $+V_{EE}$ is coupled through resistor 128 to the emitters of transistors 122 and 124 which are tied together. The collector of transistor 122 is coupled to ground and the collector of transistor 108.

The base of transistor 124 is coupled to an external power supply (not shown) which provides the reference voltage $+V_{BB}$. The base of transistor 124 is also coupled to ground through filter capacitor 116. The collector of transistor 124 is coupled to the sink driver circuitry as described later.

The source differential amplifier circuitry is coupled to the source switching element which is comprised of drive transistor 132. In particular, the collector of transistor 110 of the source differential amplifier circuitry is coupled to the gate of a P-type MOSFET transistor used as driver transistor 132. The gate of transistor 132 is also coupled to one end of inductor 134. The other end of inductor 134 is coupled through resistor 136 to the source of transistor 132. The source of transistor 132 is coupled through capacitor 138 to ground. The other end of inductor 134 is coupled to the cathode of thyristor 140. The anode of thyristor 140 coupled to a programmable positive voltage power supply (not shown) which provides the reference voltage $+PV$.

The gate of thyristor 140 is coupled through resistor 142 to the source of transistor 132. The source of transistor 132 is also coupled through sense resistor 144 to the reference voltage $+PV$. Thyristor 140 is implemented in the circuit as the source overcurrent protection controller while sense resistor 144 functions as the source current sensor.

The sink differential amplifier circuitry is coupled to the sink switching element which is comprised of drive transistor 146. The collector of transistor 124 of the sink differential amplifier circuitry is coupled to the gate of an N-type MOSFET transistor used as drive transistor 146. The gate of transistor 146 is coupled to one end of inductor 148. The other end of inductor 148 is coupled through resistor 150 to the source of transistor 146. The source of transistor 146 is coupled through capacitor 152 to ground. The other end of inductor 148 is coupled to the anode of thyristor 154. The cathode of thyristor 154 coupled to a programmable negative voltage power supply (not shown) which provides the reference voltage $-PV$.

The gate of thyristor 154 is coupled through resistor 156 to the source of transistor 146. The source of transistor 146 is also coupled through sense resistor 158 to the reference voltage $-PV$. Thyristor 154 is implemented in the circuit as the sink overcurrent protection controller while sense resistor 158 functions as the sink current sensor.

The gate of transistor 132 is coupled to the gate of transistor 146 by capacitor 160. Capacitor 160 is used for switching transition smoothing. The drain of transistor 132 and the drain of transistor 146 are coupled together to form the driver output.

The circuit of FIG. 2 utilizes MOSFET complementary transistors 132 and 146 as the driver output switching elements. Transistors 132 and 146 are driven by the output of transistors 110 and 124 of the source and sink differential amplifiers respectively comprised of transistor pair 108, 110, and transistor pair 122, 124. The differential amplifier transistors are controlled by the state of the input data bits and HI-Z signals, input to the circuit through the logic gates and coupled through zener diodes 106 and 120. Zener diodes 106 and 120 provide the voltage translation function between the operational voltages of the logic gates and the operational voltages of the differential amplifiers.

The current provided by each of the differential amplifier transistors 110 and 124 is converted to a respective gate to source voltage ($V_{GS}$). These gate to source voltages are respectively developed across resistors 136 and 150 which are respectively coupled across the gates and sources of transistors 132 and 146. The voltage $V_{GS}$ controls the conduction, i.e. switching on and off, of transistors 132 and 146.

Inductors 134 and 148 provide AC overdrive to transistors 132 and 146 during the switching transitions to enhance switching speed. It is preferred that the multiple of values of inductor 134 and resistor 136 be selected larger than the multiple of the values of inductor 148 and resistor 150. This type of component selection permits a larger gate to source voltage, $V_{GS}$, to be generated for transistor 132. This larger drive voltage is to compensate for the inherent lower efficiency of the P-type FET transistor used for transistor 132 as compared to the N-type FET transistor used for transistor 146.

Capacitor 160 provides dynamic cross-coupling between transistors 132 and 146 to smooth the turn on and turn off transitions. In addition, capacitor 160 equalizes the input to output propagation delays for both positive and negative transitions.

The overcurrent protection circuit of FIG. 2 utilizes thyristors 140 and 154 as the primary overcurrent controlling elements. When an overcurrent condition occurs, thyristors 140 or 154 trigger on. Thyristors 140 and 154 trigger on or begin conducting as a result of the respective increase in the voltage drop across sense resistors 144 and 158. When a thyristor begins conducting it shunts current away from a corresponding gate bias resistor, resistor 136 or resistor 150. By shunting the current away from resistor 136 or resistor 150, the corresponding gate to source voltage $V_{GS}$ developed across the resistor falls below the transistor gate threshold voltage of the respective one of transistors 132 or 146. When the gate to source voltage $V_{GS}$ falls below the transistor gate threshold voltage, the transistor turns off. The thyristor will remain latched on in the conduction state, thereby keeping the respective one of transistors 132 and 146 turned off, until a next input data bit of a different state occurs or, a source or a sink HI-Z input signal is provided to switch the transistor to a high impedence state or off state.

When the source or sink switching elements are disabled by the change in state of the input data bit or a source or sink HI-Z input signal, the current flowing through the thyristor will fall below the minimum holding current and the thyristor will turn off. The source and sink HI-Z inputs are normally held "high" for normal operation of the circuit. By normal operation of the circuit, it is intended that the voltage of the driver output is a positive voltage when the state of the input data bit is "high" and a negative voltage when the input data bit is "low". The circuitry returns to normal operation after an overcurrent condition occurs when the input data bit changes state and the overcurrent condition is removed. In effect, the overcurrent protection circuitry is self-resetting.

Figure 3:
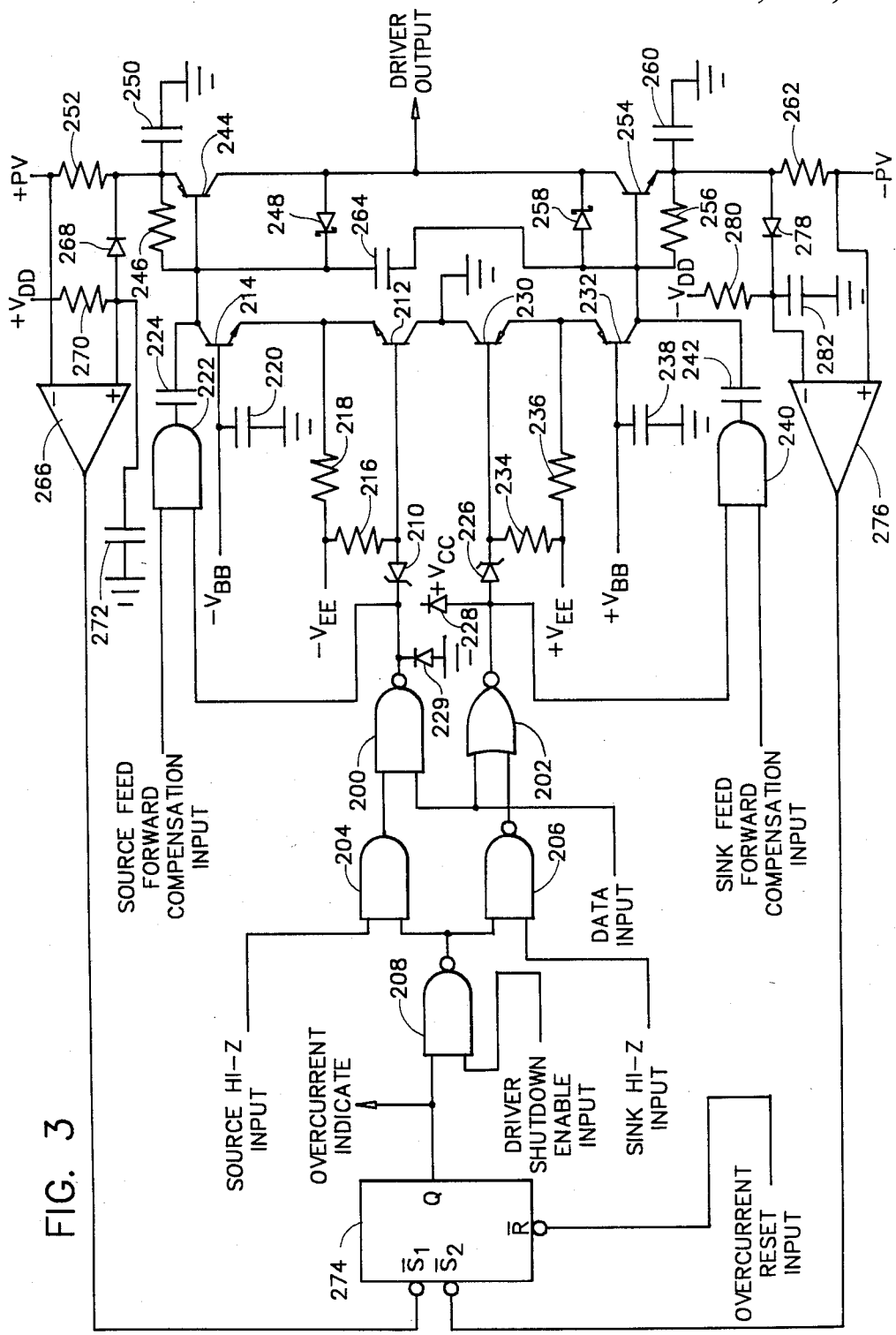
FIG. 3 is a schematical diagram of an alternate embodiment of the switching logic driver with overcurrent protection.

FIG. 3 illustrates an alternate embodiment of the switching logic driver with overcurrent protection of the present invention. The overcurrent protection scheme utilized in FIG. 3 corresponds to the alternate embodiment in FIG. 1 using feedback from the overcurrent protection control section to the input control section.

Bistate data bits generated by an external bit generator are coupled to the input of the logic driver circuit. Each data bit is simultaneously applied to an input of NAND gate 200 and NOR gate 202. The other inputs of NAND gate 200 and NOR gate 202 are respectively coupled to the outputs of AND gate 204 and NAND gate 206. One input to AND gate 204 is the source HI-Z input signal while one input to NAND gate 206 is the sink HI-Z input signal. The other input of AND gate 204 and NAND gate 206 are coupled to the output of NAND gate 208. An externally applied driver shutdown enable signal and an overcurrent indicator signal are coupled to the inputs of NAND gate 208. The driver shutdown enable signal is provided as a logic high when a driver shutdown is desired upon an overcurrent indication. If the driver shutdown enable signal is provided as a logic low, then the driver will not be automatically shut down in an overcurrent situation. However, in this mode, the "using system" could monitor the overcurrent indicate signal and provide control driver shutdown under system control. The overcurrent indicator signal is provided when an overcurrent condition occurs and is described later.

The output of NAND gate 200 is coupled to the cathode of diode 229. The anode of diode 229 is coupled to ground. Diode 229 is required when NAND gate 200 is implemented with a device that cannot source current in the logic low or "0" state.

The output of NAND gate 200 is also coupled to the cathode of zener diode 210. The anode of zener diode 210 is coupled to the base of transistor 212. Transistors 212 and 214 and their associated bias circuitry form a differential amplifier.

The base of transistor 212 is coupled through bias resistor 216 to an external power supply (not shown) which provides the negative reference voltage $-V_{EE}$. The reference voltage $-V_{EE}$ is also coupled through resistor 218 to the emitter of transistor 212. The collector of transistor 212 is connected to ground and another differential amplifier as described later.

The emitter of transistor 214 is coupled to the emitter of transistor 212 with the reference voltage $-V_{EE}$ being provided to the emitter of transistor 214 through resistor 218. The base of transistor 214 coupled to an external power source (not shown) which provides the negative reference voltage $-V_{BB}$. The base of transistor 214 is also coupled to ground through filter capacitor 220. The collector of transistor 214 is coupled to the source driver circuitry and a source feed foward compensation circuit, described later in greater detail.

The source feed forward compensation circuit includes AND gate 222 having one input coupled to the output of NAND gate 200. AND gate 222 has its other input for receiving a bistate source feed forward compensation signal. The output of NAND gate 222 is coupled to the collector of transistor 214 through capacitor 224. The feed forward compensation circuit when enabled, provides increased switching speed, and lower input to output propagation delays.

The sink switching circuitry is controlled by the output of NOR gate 202 which is coupled to the anode of zener diode 226. In addition, the output of NOR gate 202 is coupled to the anode of tie-up diode 228 which has its anode coupled to an external power source (not shown) which provides the reference voltage $+V_{CC}$. Diode 228 is utilized to limit positive voltage to a diode drop above $+V_{CC}$. This is required if NOR gate 202 is implemented with a device that cannot sink current in the logic "1" state.

The cathode of zener diode 226 is coupled to the base of transistor 230. Transistors 230 and 232 and their associated bias circuitry form a differential amplifier.

The base of transistor 230 is coupled through bias resistor 234 to an external power supply (not shown) which provides the reference voltage $+V_{EE}$. The emitter of transistor 230 is also coupled to the reference voltage $+V_{EE}$ through resistor 236. The collector of transistor 230 is connected to the collector of transistor 212 with the collectors of both transistors being coupled to ground.

The base of transistor 232 is coupled to an external power supply (not shown), which provides the reference voltage $+V_{BB}$. In addition, the base of transistor 232 is coupled to ground through filter capacitor 238. The emitter of transistor 230 is coupled to the emitter of transistor 232. The collector of transistor 232 is coupled to the sink driver circuitry and the sink feed forward compensation circuit, described later in greater detail.

The sink feed forward compensation circuit includes AND gate 240 having one input cooled to the output of NOR gate 202. AND gate 240 has its other input for receiving a bistate sink feed forward compensation signal. The output of AND gate 240 is coupled through capacitor 242 to the collector of transistor 232. The sink feed forward compensation circuit when enabled, provides increased switching speed, and lower input to output propagation delays. The source differential amplifier circuitry is coupled to the source switching element which is comprised of drive transistor 244. In particular, the collector of transistor 214 is connected to the base of a PNP transistor, drive transistor 244. Resistor 246 is coupled across the emitter and base of transistor 244. Schottky diode 248 is coupled with its anode and cathode respectively connected to the collector and base of drive transistor 244.

The emitter of transistor 244 is coupled to ground through capacitor 250. The emitter of transistor 244 is also coupled through sense resistor 252 to a positive voltage programmable power supply (not shown) which provides the programmable positive reference voltage $+PV$. This voltage appears at the collector of transistor 244 when transistor 244 is on.

The sink switching circuitry is complementary to that of the source switching circuitry just described. The collector of transistor 232 is connected to the base of a NPN transistor, drive transistor 254. Resistor 256 is coupled across the emitter and base of transistor 254. Schottky diode 258 is coupled with its cathode and anode respectively connected to the collector and base of drive transistor 254.

The emitter of transistor 254 is coupled to ground through capacitor 260. The emitter of transistor 254 is coupled through sense resistor 262 to a negative voltage programmable power supply (not shown) which provides the programmable negative reference voltage $-PV$. This voltage therefore appears at the collector of transistor 254 when transistor 254 is on. The collector of transistor 254 is connected to the collector of transistor 244 with the collectors of both transistors forming the logic driver output. Capacitor 264 is connected between the bases of transistors 244 and 254.

The overcurrent protection circuitry for the source switching element, drive transistor 244, consists of a comparator circuit. Comparator 266 has an inverting input coupled to the end of sense resistor 252 coupled to the source of the reference voltage $+PV$. The non-inverting input of comparator 266 is coupled to the anode of diode 268. The cathode of diode 268 is coupled to the other end of sense resistor 252 that is coupled to the emitter of transistor 244. The non-inverting input of comparator 266 is also coupled through bias resistor 270 to the external power supply which provides the reference voltage $+V_{DD}$ to ground through capacitor 272. The voltage $+V_{DD}$ is of a positive voltage greater than the voltage $+PV$ to keep diode 268 forward biased.

The output of comparator 266 is coupled to a set input, $S_1$, of flip-flop 274. Flip-flop 274 provides at the Q output a bistate Q output signal that is in one state during normal operation of the driver circuit. Flip-flop 274 provides an overcurrent indicate signal as the other state of the Q output signal when an overcurrent condition occurs at the source switching element output. The Q output of flip-flop 274 is coupled to the input of NAND gate 208.

The overcurrent protection circuitry for the sink switching element, drive transistor 254, also consists of a comparator circuit. Comparator 276 has a non-inverting input coupled to the end of resistor 262 coupled to the source of the reference voltage $-PV$. The inverting input of comparator 276 is coupled to the cathode of diode 278. The anode of diode 278 is coupled to the other end of resistor 262 that is coupled to the emitter of transistor 254. The inverting input of comparator 276 is coupled through bias resistor 280 to an external power supply (not shown) which provides the negative reference voltage $-V_{DD}$ and to ground through capacitor 282. The voltage $-V_{DD}$ is of voltage greater (more negative) than the voltage $-PV$.

The output of the comparator 276 is coupled to a set input, $\overline{S}_2$, of flip-flop 274. Flip-flop 274 again provides an overcurrent indicate signal as the other state of the Q output signal when an overcurrent condition occurs at the sink switching element output.

Flip-flop 274 also has a reset input, $\overline{R}$, at which a bistate overcurrent reset signal may be provided to reset the flip-flop. The reset signal, normally in one state, is provided in the other state to reset flip-flop 274 after it has changed state as the result of an overcurrent condition. Flip-flop 274 is reset for normal operating condition so that the driver output may be controlled in response to the data input and HI-Z input signals. As was discussed with reference to FIG. 2, the source HI-Z and sink HI-Z inputs provide signals which selectively turns off the drive transistors.

The circuit as described with reference to FIG. 3 uses bipolar complementary transistors, transistors 244 and 254, as the output switching elements. They are again driven by source and sink differential amplifiers respectively comprised of transistor pair 212, 214 and transistor pair 230, 232. Zener diodes 210 and 226 provide the voltage translation function between the differential amplifiers and the input logic gates.

In the output driver circuitry, schottky diodes 248 and 258 speed switching by preventing transistors 244 and 254 from saturating. Capacitor 264 provides dynamic cross-coupling between transistors 244 and 254 so as to smooth the transistors turn on and turn off transitions. In addition, capacitor 264 equalizes the input to output propagation delays for both positive and negative transitions.

Speed enhancement for each switching element is achieved by the use of a capacitive feed forward compensation circuit. Capacitors 224 and 242 are programmed via the respective driving logic gates, AND gates 222 and 240, which establish a voltage on capacitors so as to couple transition energy, in advance of the normal switching path, from outputs of NAND and NOR gates 200 and 202, to the bases of output switching transistors 244 and 254.

In the overcurrent protection circuit of FIG. 3, an overcurrent condition occurs when the voltage drop across either of sense resistors 252 and 262 exceeds a predetermined voltage threshold. This voltage threshold is the voltage drop across diodes 268 and 278. In response to the threshold voltage across resistors 252 and 262 being exceeded, a respective comparator switches from a normally high output to a low output. A low output from either comparator sets flip-flop 274 to an output state that indicates an overcurrent condition. The low state of the latch output propagated through the following logic circuitry turns off both switching transistors 244 and 254. The low state of the overcurrent reset input signal to flip-flop 274 resets flip-flop 274 for normal operation. The overcurrent reset signal may be provided manually, or automatically by an ATE system computer.

The previous description of the preferred embodiments are provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiment shown herein, but is to be accorded the widest scope consistent with the principles and novel features disclosed herein.

What is claimed is:

1. A logic driver for providing output power, received as input power from an external power source, said output power switched between two voltage levels in response to an input bistate data bit, comprising:
    input means for receiving an input bistate data bit and generating a control command corresponding to the state of an input bistate data bit said input means comprising,
    (a) input control means for receiving an input bistate data bit, for performing predetermined boolean logic operations on an input bistate data bit, and for providing a corresponding pair of output bistate logic signals, and
    (b) interface means for receiving said pair of output bistate logic signals and converting the state of each logic signal to a corresponding analog signal with each pair of converted logic signals forming said control command;
    switch means for receiving input power, said switch means responsive to said control command for, providing output power to an output at a first predetermined voltage level when an input bistate data bit is of a first state and at a second predetermined voltage level when an input bistate data bit is of a second state;
    sense means coupled to said switch means for detecting a level of current in said input power and providing a corresponding current level indication; and
    overcurrent means, responsive to said current level indication, for generating an overcurrent command when said current level indication exceeds a predetermined level, said switch means being further responsive to said overcurrent command for disabling the providing of output power at the corresponding predetermined voltage level.

2. The logic driver of claim 1 wherein said sense means comprises a pair of sensors each coupled to said switch means with each sensor responsive to the level of current in said input power corresponding to a different one of said first and second predetermined voltage levels in said output power for generating a corresponding current level signal as said current level indication.

3. The logic driver of claim 2 wherein said overcurrent means comprises a pair of overcurrent controllers each coupled to said switch means and a different sensor, each responsive to a corresponding current level signal for generating a corresponding overcurrent signal as said overcurrent command, said switch means responsive to each overcurrent signal for disabling the output of power at the corresponding predetermined voltage level at said output power sources.

4. The logic driver of claim 1 wherein said input means is further responsive to an input disable command for modifying said control command, said switch means responsive to said modified control command for disabling the output of power at a selected one of said first and second voltage level predetermined at said output.

5. The logic driver of claim 1 wherein said switch means comprises:
    switch control means responsive to each pair of converted logic signals and said overcurrent command for generating a pair of switch control signals; and
    a pair of switch element means each responsive to a different one of said pair of switch control signals and each for receiving power from an external power source at a different one of said first and second predetermined voltage levels and selectively providing output power at a different one of said first and second predetermined voltage levels.

6. The logic driver of claim 5 wherein said sense means comprises a pair of sensors each coupled to a different switch element means of said pair of switch element means with each sensor providing a current level signal representative of the current provided from an external power source to a corresponding switch element means.

7. The logic driver of claim 6 wherein said overcurrent means comprises a pair of overcurrent controllers each coupled to a different sensor and switch means, each overcurrent controller responsive to a corresponding current level signal so as to generate overcurrent signal provided to a corresponding one of said switch element means when the output power current level exceeds a predetermined level, each switch element means responsive to a corresponding overcurrent signal for disabling the output of power.

8. A logic driver for providing output power, received as input power from an external power source, said output power switched between two voltage levels in response to an input bistate data bit, comprising:
    input means for receiving an input bistate data bit and generating a control command corresponding to the state of an input bistate data bit said input means comprising,
    (a) input control means for receiving an input bistate data bit and and an overcurrent command in the form of a pair of bistate overcurrent signals, for performing predetermined boolean logic on an input bistate data bit and a pair of input bistate overcurrent signals, and providing a corresponding pair of output bistate logic signals, and
    (b) interface means for receiving said pair of output bistate logic signals and converting the state of each output logic signal to a corresponding analog signal with each converted logic signals forming said control commands;
    switch means for receiving input power, said switch means responsive to said control command for, providing output power to an output at a first predetermined voltage level when an input bistate data bit is of a first state and at a second predetermined voltage level when an input bistate data bit is of a second state;
    sense means coupled to said switch means for detecting a level of current in said input power and providing a corresponding current level indication; and
    overcurrent means, responsive to said current level indication, for generating an overcurrent command when said current level indication exceeds a predetermined level, said input means being further responsive to said overcurrent command for modifying said control command, said switch means responsive to said modified control command for disabling the providing of output power at the corresponding predetermined voltage level.

9. The logic driver of claim 8 wherein said sense means comprises a pair of sensors each coupled to said switch means with each sensor responsive to the level of current in said input power corresponding to a different one of said first and second predetermined voltage levels in said output power for generating a corresponding current level signal as said current level indication.

10. The logic driver of claim 9 wherein said overcurrent means comprises a pair of overcurrent controllers each coupled to said switch means and a different sensor, each overcurrent controller responsive to a corresponding current level signal for generating a corresponding overcurrent signal as said overcurrent command, said switch means responsive to each overcurrent signal for disabling the output of power at the corresponding predetermined voltage level at said output.

11. The logic driver of claim 8 wherein said input means is further responsive to an input disable command for modifying said control command, said switch means responsive to said modified control command for disabling the output of power at a selected one of said first and second predetermined voltage level at said output.

12. The logic driver of claim 8 wherein said switch means comprises:
   switch control means responsive to each pair of converted logic signals for generating a pair of switch control signals; and
   a pair of switch element means each responsive to a different one of said pair of switch control signals and each for, receiving power from an external power source at a different one of said first and second predetermined voltage levels and selectively providing output power at a different one of said first and second predetermined voltage levels.

13. The logic driver of claim 12 wherein said sense means comprises a pair of sensors each coupled to a different switch element means of said pair of switch element means with each sensor providing a current level signal representative of the current provided from an external power source to a corresponding switch element means.

14. The logic driver of claim 13 wherein said overcurrent means comprises a pair of overcurrent controllers each coupled to a different sensor and switch element means, each overcurrent controller responsive to a corresponding current level signal so as to generate a bistate overcurrent signal provided to said input control means when the output power current level exceeds a predetermined level, said input control means responsive to an overcurrent signal providing said bistate logic signal of a state converted by said interface means and provided to said switch control means for generating a switch control signal to a corresponding switching element means for disabling the output of power.

15. A logic driver for coupling input power as output power to a load in response to a bistate input signal, comprising:
   bistate switch means for receiving input power and responsive to a bistate input signal for, while in a switch first state in response to an input signal first state, changing to a switch second state in response to an input signal second state, and for, while in a switch second state, changing to said switch first state in response to said input signal first state, said switch means providing output power to a load when in said switch first state;
   bistate controller means coupled to said switch means for, while in a controller first state, changing to a controller second state when the level of current in output power from said switch means exceeds a predetermined level, said controller means for generating a control signal when in said controller second state and said switch means responsive to said control signal for changing to said switch second state, and said controller means for, while in said controller second state changing to said controller first state in response to said input signal second state wherein said controller means comprises, means for sensing the level of current in said output power and providing a corresponding sense signal, and thyristor means responsive to said sense signal for generating said control signal when said sense signal exceeds a predetermined value, said thyristor means including a thyristor having a gate, an anode and a cathode, said gate coupled to said sense means and one of said anode and cathode adapted for receiving input power and the other of said anode and cathode coupled to said switch means wherein said thyristor diverts input power from said switch means so as to change said switch means from said switch first state to said switch second state.

16. The logic driver of claim 15 wherein said switch means is diabled in said switch second state from providing output power.

* * * * *